United States Patent [19]

Satoh et al.

[11] Patent Number: 4,959,201
[45] Date of Patent: Sep. 25, 1990

[54] GREEN DIAMOND AND METHOD OF PRODUCING THE SAME

[75] Inventors: Shuichi Satoh; Kazuwo Tsuji, both of Hyogo, Japan

[73] Assignee: Sumitomo Electric Industries, Ltd., Osaka, Japan

[21] Appl. No.: 292,754

[22] Filed: Dec. 30, 1988

[30] Foreign Application Priority Data

Jan. 13, 1988 [JP] Japan ................. 63-5573

[51] Int. Cl.$^5$ .............................. C01B 31/06
[52] U.S. Cl. .................. 423/446; 156/DIG. 68; 372/37; 501/86
[58] Field of Search ............. 423/446; 132/DIG. 68; 372/37; 501/86

[56] References Cited

U.S. PATENT DOCUMENTS

| | | | |
|---|---|---|---|
| 3,616,357 | 10/1971 | Haynes | 204/157.47 |
| 4,073,380 | 2/1978 | Strong et al. | 423/446 |
| 4,082,185 | 4/1978 | Strong | 423/446 |
| 4,174,380 | 11/1979 | Strong et al. | 423/446 |
| 4,399,364 | 8/1983 | Evans et al. | 423/446 |

FOREIGN PATENT DOCUMENTS 136408  4/1985  European Pat. Off. ............ 423/446

OTHER PUBLICATIONS

Rand, Synthetic Diamond for Color Center Lasers, FA9-1, pp. 138-140.
Reports on Progress in Physics, vol. 42, 1979, pp. 1606-1659, Optical Absorption and Luminescence by J. Walker.

*Primary Examiner*—Olik Chaudhuri
*Assistant Examiner*—Robert M. Kunemund
*Attorney, Agent, or Firm*—W. G. Fasse; D. H. Kane, Jr.

[57] ABSTRACT

A green diamond has a nitrogen content in its crystals within the range of $5 \times 10^{16}$ to $3 \times 10^{19}$ atoms/cm$^3$, an absorption coefficient of H2 centers at a wavelength of 800 nm within the range of 0.3 to 6 cm$^{-1}$, an absorption coefficient of the Ib type nitrogen at a wavelength of 500 nm within the range of 0.05 to 1.5 cm$^{-1}$, and absorption coefficients of H3 centers, H4 centers, N-V centers and GR1 centers in the visible region of not more than 0.2 cm$^{-1}$. Such green diamonds are produced by preparing a clear-yellow Ib type diamond having a nitrogen content in crystals within the range of $5 \times 10^{16}$ to $3 \times 10^{19}$ atoms/cm$^3$, irradiating this diamond with an electron beam having not less than $1 \times 10^{18}$ electrons/cm$^2$ at an accelerating voltage of 2 to 4 MeV, and subjecting the diamond to a heat treatment at a temperature of 1500° C.–1800° C. in a vacuum of not more than $10^{-3}$ torr.

10 Claims, No Drawings

GREEN DIAMOND AND METHOD OF PRODUCING THE SAME

BACKGROUND OF THE INVENTION

1. Field of the Invention

The present invention relates to a green diamond suitable for ornamental purposes and a method of producing such a green diamond.

2. Background Art

Diamonds are classified into four types, Ia, Ib, IIa and IIb, as shown in Table 1, according to the kind and distribution of impurities contained and their optical properties.

TABLE 1

| Classification of Diamonds | Color | Configuration in which Nitrogen Exists | | | |
|---|---|---|---|---|---|
| | | Isolated nitrogen atoms | 1 pair of nitrogen atoms | 2 pairs of nitrogen atoms | 3 nitrogen atoms |
| IIa | Transparent colorless | Absent | Absent | Absent | Absent |
| Ia | Transparent colorless | Absent | Present | Present | Absent |
| | Light yellow | Absent | Present | Present | Few |
| | Yellow | Present | Present | Present | Present |
| | Brown | Many | Present | Present | Many |
| IIb | Blue | Absent (containing B) | Absent | Absent | Absent |
| Ib | Clear yellow | Present | Absent | Absent | Absent |

Most of the natural diamonds are of the Ia type, except that about 1% is of the IIa type, about 0.2% is of the Ib type, and the IIb type occurs rarely. On the other hand, most of the artificial diamonds produced by the temperature gradient method are of the Ib type.

Diamonds, whether natural or artificial, can be colored because of the presence of color centers in crystals. Color centers stem from lattice defects and nitrogen atoms. Typical color centers in the visible range are given in Table 2.

TABLE 2

| Name | Composition of color center | Color |
|---|---|---|
| H3 Center | 1 pair of nitrogen atoms - lattice defect | Yellow |
| H4 Center | 2 pairs of nitrogen atoms - lattice defect | Yellow |
| N-V Center | Isolated nitrogen atoms - lattice defect | Purple |
| GR1 Center | Lattice defect | Bluish green |

The characteristics and artificial production of these color centers are discussed in detail by John Walker in the Reports on Progress in Physics, Vol. 42, 1979. The artificial production method of color centers outlined therein comprises the steps of forming lattice defects in crystals by electron beam irradiation and, if necessary, performing annealing to cause said lattice defects to combine with nitrogen atoms contained in the crystals.

The color of a diamond colored by utilizing this color center formation method is the color of the rough diamond combined with the color of the color center produced. Thus, in order to obtain the ornamental value which means transparency and brilliant color, it has been usual practice to use, as rough diamonds, transparent white or light yellow, abundantly-occurring natural diamonds of the Ia and IIa types. These Ia and IIa type natural diamonds either have no nitrogen whatsoever or have one or two pairs of nitrogen atoms, as shown in Table 1. Therefore, as can be seen from Table 2, the color centers which can be formed in these rough diamonds by the method described above, are only the bluish green GR1 center (lattice defect), yellow H3 center (one pair of nitrogen atoms - lattice defect) and yellow H4 center (2 pairs of nitrogen atoms - lattice defect). Therefore, conventional colored diamonds have been limited in color to yellow and bluish green.

A report on a study of H2 centers which show green is published in The Reports on Progress in Physics mentioned above. According to this report, H2 centers are formed by a method which comprises the steps of irradiating a Ia type natural diamond with an electron beam having not less than $1 \times 10^{16}$–$1 \times 10^{18}$ electrons/cm² at an accelerating voltage of 1-5 MeV and heat-treating it at a temperature of 600°–1200° C. in a vacuum. With this method, however, H3 and H4 centers are inevitably formed by the one pair and two pairs of nitrogen atoms simultaneously contained in the diamond. In that case, since absorption of H3 centers is stronger than that of H2 centers, the diamonds that can be obtained are yellow diamonds only. Furthermore, with this conventional method used, it has been found that if a diamond of the Ib type which does contain nitrogen but in which nitrogen atoms exist isolated, is used as a rough diamond for coloring purposes, no H2 center is formed at all; much less the use of the IIa type which contains no nitrogen.

SUMMARY OF THE INVENTION

An object of the invention is to provide a green-colored diamond in which substantially H2 centers alone are present as color centers.

Another object of the invention is to provide a method of producing such a green-colored diamond.

A green diamond according to the invention is characterized in that the nitrogen content in the crystals is $5 \times 10^{16}$–$3 \times 10^{19}$ atoms/cm³, the absorption coefficient of H2 centers at a wavelength of 800 nm is 0.3-6 cm$^{-1}$, the absorption coefficient of the Ib type nitrogen at a wavelength of 500 nm is 0.05-1.5 cm$^{-1}$, and the absorption coefficients of H3 centers, H4 centers, N-V centers and GR1 centers in the visible range are 0.2 cm$^{-1}$ or below.

The green diamond described above is produced by the following method: A bright yellow diamond of the Ib type in which the nitrogen content in the crystals is $5 \times 10^{16}$–$3 \times 10^{19}$ atoms/cm³ is irradiated with an electron beam having not less than $1 \times 10^{18}$ electrons/cm² at an accelerating voltage of 2-4 MeV. The diamond is then subjected to a heat treatment at a temperature of 1500° C.–1800° C. in a vacuum of not more than $10^{-3}$ torr.

The above-described green diamond can also be produced by the following method: First, a bright yellow diamond of the Ib type in which the nitrogen content in the crystals is $5 \times 10^{16} - 3 \times 10^{19}$ atoms/cm$^3$ is irradiated with an electron beam having not less than $1 \times 10^{18}$ electrons/cm$^2$ at an accelerating voltage of 2–4 MeV. The diamond is then subjected to a heat treatment at a temperature of not less than 1600° C. at a high pressure of not less than 3.0 GPa.

In order to form a diamond having only green H2 centers, it is necessary that the rough diamond contain nitrogen in its crystals and that the nitrogen atoms are isolated nitrogen atoms which do not form H3 or H4 centers. From this point of view, the present invention uses a bright yellow Ib type diamond as a rough diamond for coloring purposes; however, since the natural yield of Ib type diamonds is very low, it is better to use artificial diamonds.

However, even if a Ib type diamond is used, no green H2 center can be formed by the conventional method. In contrast therewith, according to the method of the present invention method, substantially H2 centers alone can be formed in a Ib type diamond.

That is, by subjecting a Ib type diamond to:

(1) the step of electron beam irradiation using $1 \times 10^{18}$ electrons/cm$^2$ at an accelerating voltage of 2–4 MeV, and (2a) either the step of heat treatment at a temperature of 1500° C.–1800° C. in a vacuum of $10^{-3}$ torr, (2b) or the step of heat treatment at a temperature of not less than 1600° C. at an ultrahigh voltage of not less than 3.0 GPa, H2 centers, that could not be formed practically heretofore in Ib type diamonds, can now be formed in such Ib type diamonds.

In the step (1), if the accelerating voltage is less than 2 MeV, H2 centers cannot be uniformly formed, while if it exceeds 4 MeV, there is the danger of included metals and other inclusions being activated. Further, if the amount of electron beam irradiation is less than $1 \times 10^{18}$ electrons/cm$^2$, almost no H2 center is formed.

In the step (2a), if the temperature for heating in a vacuum is lower than 1500° C., no H2 center is formed, while if it exceeds 1800° C., the diamond changes into graphite. The use of a low degree of vacuum which exceeds $10^{-3}$ torr could also change part of the diamond into graphite.

On the other hand, in the case of heating at an ultrahigh voltage in the step (2b), no H2 center is formed unless the temperature is above 1600° C., while the diamond changes into graphite if the pressure is less than 3.0 GPa.

However, if the above step (2a) or (2b) alone is used, the formation of H2 centers is attended by the formation of N-V centers and sometimes also by the formation of H3 and H4 centers. Therefore, in the present method of the invention, 10 hours or more or preferably 20 hours or more are allocated to heating in the step (2a) or (2b), thereby making it possible to eliminate these undesirable color centers while retaining substantially H2 centers alone.

Diamonds obtained by the present method have substantially only H2 centers existing therein and show a brilliant green. H2 centers are absorptive at 650–1000 nm, their absorption peak being at 800 nm, absorbing red and hence showing its complementary color, or green. However, if the absorption coefficient at 800 nm is less than 0.3 cm$^{-1}$, the green is dimmed but, reversely, if it exceed 6 cm$^{-1}$, the transparency is lost. Further, if the nitrogen content in the crystals of a Ib type diamond used for coloration is less than $5 \times 10^{16}$ atoms/cm$^3$, the absorption coefficient of H2 centers at 800 nm does not reach 0.3 cm$^{-1}$ even if the present inventive method is used but, reversely, if it exceeds $3 \times 10^{19}$ atoms/cm$^3$, the absorption coefficient exceeds 6 cm$^{-1}$; in either case, the diamond fails to show a green color which is brilliant and which exhibits a transparent appearance or has a transparency.

The absorption by Ib type nitrogen included in Ib type diamonds lies at 400–500 nm, and since the absorption is greater on the shorter wavelength side, it mainly absorbs purple and indigo, showing a clear yellow which is complementary thereto. When the yellow from this Ib type nitrogen is light, it mixes with the green from H2 centers, so that the brilliancy of the green increases. However, when yellow becomes deep, the transparent sensation is lost and yellowish green appears. In order to enhance the preferable light yellow, it is necessary that the absorption coefficient of Ib type nitrogen at 500 nm is within the range of 0.05–1.5 cm$^{-1}$.

Further, H3 and H4 centers have their absorption peaks in the vicinity of 480 nm and show deep yellow, while N-V centers show purple and GR1 centers show bluish green. When these color centers are simultaneously present, the sensation of a brilliant color is lost, but no adverse effect develops so long as their absorption coefficients are hot more than 0.2 cm$^{-1}$.

EXAMPLE 1

Five clear-yellow Ib type artificial diamonds (whose nitrogen content was $3 \times 10^{16} - 5 \times 10^{19}$ atoms/cm$^3$) synthesized by the temperature gradient method to serve as rough diamonds, were first subjected to electron beam irradiation using $1 \times 10^{19}$ electrons/cm$^2$ at an accelerating voltage of 3 MeV, and then subjected to 30 hours of heat treatment at an ultrahigh pressure of 5.0 GPa and a temperature of 1750° C.

The green diamond samples obtained were tested for the absorption coefficient of H2 centers (at 800 nm), Ib centers (at 500 nm), and H3 and other centers. The results are shown in Table 3.

Further, the green diamond samples were brilliant-cut into pieces of 0.4–0.5 carat, on which a questionnaire was addressed to 100 women aged 18–65, as to the following questions:

(1) Does the sample show green?
(2) Does it induce a transparent sensation?
(3) Is the color brilliant?
(4) Does it have an ornamental value?

The result of this questionnaire is shown in Table 3.

TABLE 3

| Sample | 1* | 2 | 3 | 4 | 5* |
|---|---|---|---|---|---|
| Nitrogen quantity (atoms/cm$^3$) | $3 \times 10^{16}$ | $5 \times 10^{16}$ | $5 \times 10^{18}$ | $3 \times 10^{19}$ | $5 \times 10^{19}$ |
| Absorption | | | | | |

| Sample | 1* | 2 | 3 | 4 | 5* |
|---|---|---|---|---|---|
| coefficient (cm$^{-1}$) | | | | | |
| H2 center | 0.1 | 0.3 | 0.8 | 6 | 9 |
| Ib type nitrogen | 0 | 0.05 | 0.4 | 1.5 | 2 |
| Others | 0 | 0 | 0 | 0 | 0 |
| Result of questionnaire (number of persons) | | | | | |
| (1) It is green. | 5 | 74 | 95 | 92 | 82 |
| (2) It induces a transparent sense. | 100 | 100 | 100 | 89 | 42 |
| (3) Its color is brilliant. | 5 | 81 | 98 | 84 | 51 |
| (4) It has an ornamental value | 45 | 71 | 95 | 78 | 39 |

(Note) The mark (*) indicates a comparative example.

EXAMPLE 2

Four clear-yellow Ib type artificial diamonds (whose nitrogen content was $6 \times 10^{18}$ atoms/cm$^3$) synthesized by the temperature gradient method to serve as rough diamonds, were first subjected to an electron beam irradiation using $5 \times 10^{17}$ –$1 \times 10^{19}$ electrons/cm$^2$ at an accelerating voltage of 4 MeV, and then subjected to 5–30 hours of heat treatment at an ultrahigh pressure of 5.0 GPa and a temperature of 1750° C.

The green diamond samples obtained were tested for the absorption coefficient in the same manner as in Example 1. Further, the samples were brilliant-cut into pieces of 0.7–0.8 carat, on which a questionnaire similar to the one in Example 1 was conducted.

The result is shown in Table 4.

TABLE 4

| Sample | 6* | 7* | 8* | 9 |
|---|---|---|---|---|
| Electron beam irradiation dosage (electrons/cm$^2$) | $5 \times 10^{17}$ | $1 \times 10^{18}$ | $1 \times 10^{19}$ | $1 \times 10^{19}$ |
| Heating time (hr) | 30 | 5 | 10 | 20 |
| Absorption coefficient (cm$^{-1}$) | | | | |
| H2 center | 0 | 1.1 | 1.0 | 0.9 |
| Ib type nitrogen | 0.4 | 0.5 | 0.4 | 0.4 |
| Others | 0 | 0.9 | 0.3 | 0.1 |
| Result of questionnaire number of persons) | | | | |
| (1) It is green. | 0 | 55 | 87 | 99 |
| (2) it induces a transparent sense. | 100 | 96 | 95 | 98 |
| (3) Its color is brilliant. | 44 | 27 | 52 | 98 |
| (4) It has the ornamental value. | 36 | 18 | 49 | 96 |

(Note) The mark (*) indicates a comparative example.

EXAMPLE 3

Three clear-yellow Ib type artificial diamonds (whose nitrogen content was $7 \times 10^{18}$ atoms/cm$^3$) synthesized by the temperature gradient method to serve as rough diamonds, were first subjected to an electron beam irradiation using $1 \times 10^{19}$ electrons/cm$^2$ at an accelerating voltage of 3 MeV, and then subjected to 20 hours of heat treatment in a vacuum of $10^{-3}$ torr at a temperature of 1300° C.–1700° C.

The green diamond samples obtained were tested for the absorption coefficient in the same manner as in Example 1. Further, the samples were brilliant-cut into pieces of 0.5–0.6 carat, on which a questionnaire similar to the one in Example 1 was conducted. The result is shown in Table 5.

TABLE 5

| Sample | 10* | 11 | 12 |
|---|---|---|---|
| Heating temperature (°C.) | 1300 | 1500 | 1700 |
| Absorption coefficient (cm$^{-1}$) | | | |
| H2 center | 0 | 1.2 | 1.0 |
| Ib type nitrogen | 0.5 | 0.5 | 0.4 |
| Others | 0.4 | 0.2 | 0 |
| Result of questionnaire (number of persons) | | | |
| (1) It is green. | 0 | 90 | 98 |
| (2) it induces a transparent sense. | 100 | 95 | 100 |
| (3) Its color is brilliant. | 39 | 92 | 97 |
| (4) It has the ornamental value. | 36 | 90 | 95 |

(Note) The mark (*) indicates a comparative example.

EXAMPLE 4

Three clear-yellow Ib type artificial diamonds (whose nitrogen content was $4.4 \times 10^{18}$ atoms/cm$^3$) synthesized by the temperature gradient method to serve as rough diamonds, were first subjected to an electron beam irradiation using $1 \times 10^{19}$ electrons/cm$^2$ at an accelerating voltage of 3 MeV, and then subjected to 30 hours of heat treatment at an ultrahigh pressure of 3.0 GPa at a temperature of 1400° C.–1800° C.

The green diamond samples obtained were tested for the absorption coefficient in the same manner as in Example 1. Further, the samples were brilliant-cut into pieces of 0.5–0.6 carat, on which a questionnaire similar to the one in Example 1 was conducted. The result is shown in Table 6.

TABLE 6

| Sample | 13* | 14 | 15 |
|---|---|---|---|
| Heating temperature (°C.) | 1400 | 1600 | 1800 |
| Absorption coefficient (cm$^{-1}$) | | | |
| H2 center | 0 | 0.8 | 0.7 |
| Ib type nitrogen | 0.35 | 0.3 | 0.3 |
| Others | 0.2 | 0.1 | 0 |
| Result of questionnaire (number of persons) | | | |
| (1) It is green. | 0 | 87 | 92 |
| (2) it induces a transparent sense. | 100 | 99 | 100 |
| (3) Its color is brilliant. | 44 | 95 | 95 |
| (4) It has the ornamental value. | 45 | 89 | 91 |

(Note) The mark (*) indicates a comparative example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A green diamond comprising Ib-type diamond crystals with a nitrogen content within the range of $5 \times 10^{16}$ to $3 \times 10^{19}$ atoms/cm$^3$, an absorption coefficient of H2 centers at a wavelength of 800 nm is 0.3 to 6 cm$^{-1}$, an absorption coefficient of Ib type nitrogen at a wavelength of 500 nm within the range of 0.05 to 1.5 cm$^{-1}$, and absorption coefficients of H3 centers, H4 centers, N-V centers and GR1 centers in the visible range of not more than 0.2 cm$^{-1}$, said diamond having a brilliant green transparency.

2. A method of producing a green diamond having a brilliant green transparency, comprising the steps of: preparing a clear-yellow Ib-type diamond having nitrogen in crystals within the range of $5 \times 10^{16}$ to $3 \times 10^{19}$ atoms/cm$^3$, irradiating said diamond with an electron beam having not less than $1 \times 10^{18}$ electrons/cm$^2$ at an accelerating voltage of 2 to 4 MeV, and subjecting said diamond to a heat treatment at a temperature of 1500° C.–1800° C. in a vacuum of not more than $10^{-3}$ torr, whereby said diamond has an absorption coefficient of H2 centers at a wavelength of 800 nm within 0.3 to 6 cm$^{-1}$, an absorption coefficient of Ib-type nitrogen at a wavelength of 500 nm within the range of 0.05 to 1.5 cm$^{-1}$, and absorption coefficients of H3 centers, H4 centers, N-V centers and GR1 centers in the visible range of not more than 0.2 cm$^{-1}$ for obtaining said brilliant green transparency.

3. The method of producing the green diamond as set forth in claim 2, wherein: said Ib type diamond is an artificial diamond.

4. The method of producing the green diamond as set forth in claim 2, wherein: said Ib type diamond is an artificial diamond synthesized by the temperature gradient method.

5. The method of producing the green diamond as set forth in claim 2, wherein: said heat treatment is conducted for 10 hours or more.

6. The method of producing the green diamond as set forth in claim 2, wherein: said heat treatment is conducted for 20 hours or more.

7. A method of producing a green diamond having a brilliant green transparency, comprising the steps of: preparing a clear-yellow Ib-type diamond having nitrogen in crystals within the range of $5 \times 10^{16}$ to $3 \times 10^{19}$ atoms/cm$^3$, irradiating said diamond with an electron beam having not less than $1 \times 10^{18}$ electrons/cm$^2$ at an accelerating voltage of 2 to 4 MeV, and subjecting said diamond to a heat treatment at a temperature of not less than 1600° C. at a high pressure of not less than 3.0 GPa, whereby said diamond has an absorption coefficient of H2 centers at a wavelength of 800 nm within 0.3 to 6 cm$^{-1}$, an absorption coefficient of Ib-type nitrogen at a wavelength of 500 nm within the range of 0.05 to 1.5 cm$^{-1}$, and absorption coefficients of H3 centers, H4 centers, N-V centers and GR1 centers in the visible range of not more than 0.2 cm$^{-1}$ for obtaining said brilliant green transparency.

8. The method of producing the green diamond as set forth in claim 7, wherein: said Ib type diamond is an artificial diamond.

9. The method of producing the green diamond as set forth in claim 7, wherein: said Ib type diamond is an artificial diamond synthesized by the temperature gradient method.

10. The method of producing the green diamond as set forth in claim 7, wherein: said heat treatment is conducted for not less than 10 hours.

* * * * *